US012648375B2

(12) United States Patent
Madia et al.

(10) Patent No.: US 12,648,375 B2
(45) Date of Patent: Jun. 2, 2026

(54) STRUCTURE AND FORMATION METHOD OF DEVICE WITH FERROELECTRIC LAYER

(71) Applicant: TAIWAN SEMICONDUCTOR MANUFACTURING COMPANY, LTD., Hsinchu (TW)

(72) Inventors: Oreste Madia, Brussels (BE); Georgios Vellianitis, Heverlee (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 876 days.

(21) Appl. No.: 17/732,873

(22) Filed: Apr. 29, 2022

(65) Prior Publication Data

US 2023/0352296 A1 Nov. 2, 2023

(51) Int. Cl.
| | |
|---|---|
| *H10D 64/68* | (2025.01) |
| *H10D 64/01* | (2025.01) |
| *H10P 14/60* | (2026.01) |
| *H10P 14/692* | (2026.01) |

(52) U.S. Cl.
CPC ..... *H10P 14/69392* (2026.01); *H10D 64/033* (2025.01); *H10D 64/691* (2025.01); *H10P 14/6544* (2026.01)

(58) Field of Classification Search
CPC ..................................................... H01L 29/401
See application file for complete search history.

(56) References Cited

U.S. PATENT DOCUMENTS

| | | | |
|---|---|---|---|
| 2011/0140064 A1* | 6/2011 | Bandyopadhyay .... | H10D 62/83 257/104 |
| 2017/0244026 A1* | 8/2017 | Wu ........................ | H10N 70/20 |
| 2019/0355584 A1* | 11/2019 | Yamaguchi ............ | H10B 51/10 |

* cited by examiner

*Primary Examiner* — Mohammad M Choudhry
(74) *Attorney, Agent, or Firm* — Birch, Stewart, Kolasch & Birch, LLP

(57) ABSTRACT
A device structure and a formation method are provided. The method includes forming a first carbon-containing layer over a substrate and forming a hafnium-containing oxide layer over the first carbon-containing layer. The method also includes forming a second carbon-containing layer over the hafnium-containing oxide layer. The method further includes crystallizing the hafnium-containing oxide layer while the hafnium-containing oxide layer is between the first carbon-containing layer and the second carbon-containing layer.

20 Claims, 16 Drawing Sheets

406'

404

400

410

406'

404

400

504    510    506'    500

512A    512B    504    510    506'    500

704

702

708

706'

700

704

702

706'

700

704
702
710
706'
700

712A
712B
704
702
710
706'
700

STRUCTURE AND FORMATION METHOD OF DEVICE WITH FERROELECTRIC LAYER

BACKGROUND

The integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
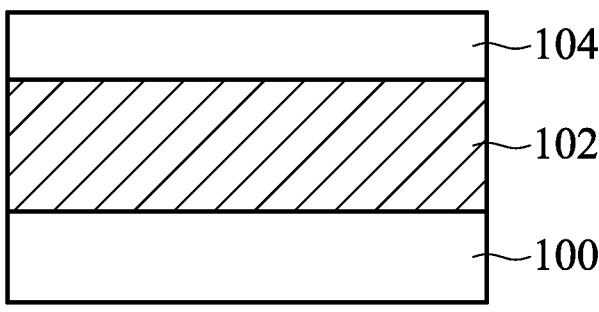
FIGS. 1A-IE are cross-sectional views of various stages of a process for forming a portion of a device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the device structure. Some of the features described below can be replaced or eliminated for different embodiments. Although some embodiments are discussed with operations performed in a particular order, these operations may be performed in another logical order.

FIGS. 1A-IE are cross-sectional views of various stages of a process for forming a portion of a device structure, in accordance with some embodiments. As shown in FIG. 1A, a substrate 100 is received or provided. In some embodiments, the substrate 100 is a bulk semiconductor substrate, such as a semiconductor wafer. The substrate 100 may include silicon or other elementary semiconductor materials such as germanium. The substrate 100 may include an interconnection structure with multiple dielectric layers and multiple conductive features. In some other embodiments, the substrate 100 is a dielectric substrate such as a glass substrate.

As shown in FIG. 1A, a bottom electrode 102 is formed over the substrate 100, in accordance with some embodiments. In some embodiments, the bottom electrode 102 is formed over the interconnection structure of the substrate 100. In some other embodiments, the bottom electrode 102 is surrounded by the interconnection structure of the substrate 100.

In some embodiments, the bottom electrode 102 is made of or includes a metal-containing material. The bottom electrode 102 may be made of or include tungsten (W), tungsten carbide (WC), tungsten nitride (WN), aluminum (Al), aluminum nitride (AlN), titanium (Ti), titanium nitride (TiN), niobium (Nb), ruthenium (Ru), platinum (Pt), gold (Au), one or more other suitable materials, or a combination thereof. The formation of the bottom electrode 102 may involve one or more deposition processes, one or more patterning processes, and/or one or more planarization processes. For example, one or more damascene processes may be used to form the bottom electrode 102.

As shown in FIG. 1A, a carbon-containing layer 104 is deposited over the bottom electrode 102, in accordance with some embodiments. In some embodiments, the carbon-containing layer 104 is in direct contact with the bottom electrode 102. In some embodiments, the carbon-containing layer 104 is a pure carbon layer. In some embodiments, the carbon-containing layer 104 is amorphous. The thickness of the carbon-containing layer 104 may be within a range from about 2 angstroms to about 10 nm. In some embodiments, the carbon-containing layer 104 has a lower coefficient of thermal expansion (CTE) than that of the bottom electrode 102. The CTE of the carbon-containing layer 104 may be within a range from about $10^{-7}K^{-1}$ to about $10^{-6}K^{-1}$.

The carbon-containing layer 104 may be deposited using a CVD process, an atomic layer deposition (ALD) process, a plasma enhanced chemical vapor deposition (PECVD) process, a plasma enhanced atomic layer deposition (PEALD) process, a PVD process, a molecular beam epitaxy process (MBE), one or more other applicable processes, or a combination thereof. The precursor gases used for forming the carbon-containing layer 104 may include one or more halogen- and carbon-containing gases and hydrogen. The formation of the carbon-containing layer 104 may further involve one or more patterning processes.

Figure 1B:
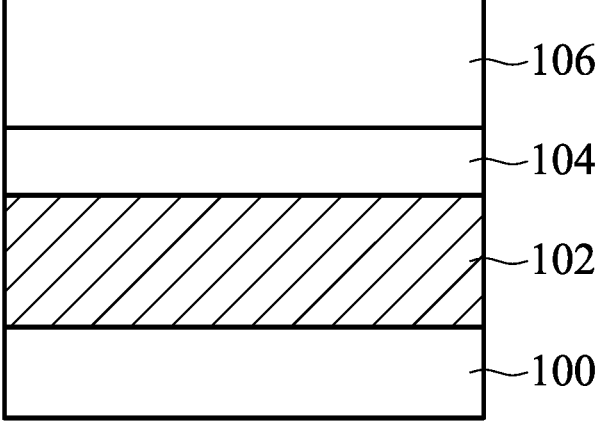

As shown in FIG. 1B, a ferroelectric layer 106 is deposited over the carbon-containing layer 104, in accordance with some embodiments. In some embodiments, the ferroelectric layer 106 is in direct contact with the carbon-containing layer 104. In some embodiments, the ferroelectric layer 106 is a hafnium-containing oxide layer. For example, the ferroelectric layer 106 is made of hafnium zirconium oxide (HZO). The atomic concentration of hafnium of the ferroelectric layer 106 may be within a range from about 30% to about 75%. In some embodiments, the ferroelectric layer 106 is amorphous.

The ferroelectric layer 106 may be deposited using an ALD process, a CVD process, one or more other applicable processes, or a combination thereof. The precursor gases used for forming the ferroelectric layer 106 may include a hafnium-containing gas such as hafnium chloride, dimethylamido hafnium, one or more other suitable precursors, or a combination thereof. The precursor gases used for forming the ferroelectric layer 106 may also include a zirconium-containing gas such as zirconium chloride, dimethylamido zirconium, one or more other suitable precursors, or a combination thereof. The precursor gases used for forming the ferroelectric layer 106 may further include oxidant such as oxygen, ozone, water, hydrogen peroxide, one or more other suitable oxidants, or a combination thereof. The formation of the ferroelectric layer 106 may further involve one or more patterning processes.

Figure 1C:
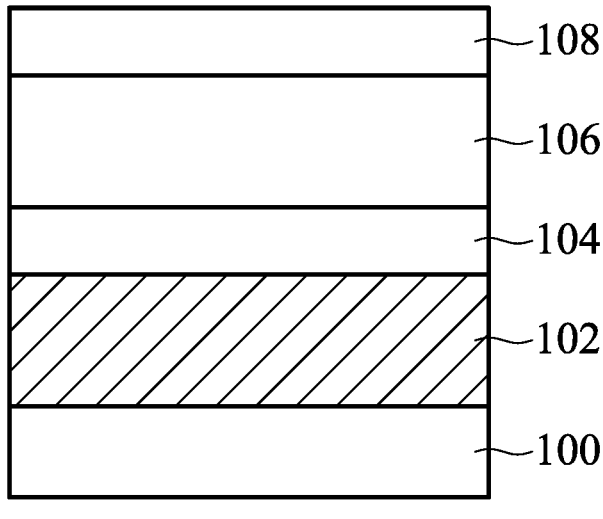

As shown in FIG. 1C, a carbon-containing layer 108 is deposited over the ferroelectric layer 106, in accordance with some embodiments. In some embodiments, the carbon-containing layer 108 is in direct contact with the ferroelectric layer 106. In some embodiments, the material and formation method of the carbon-containing layer 108 are the same as or similar to those of the carbon-containing layer 104. In some embodiments, the carbon-containing layer 108 is amorphous. The thickness of the carbon-containing layer 108 may be within a range from about 2 angstroms to about 10 nm. In some embodiments, the carbon-containing layer 108 has a lower coefficient of thermal expansion (CTE) than that of the ferroelectric layer 106. The CTE of the carbon-containing layer 108 may be within a range from about $10^{-7}K^{-1}$ to about $10^{-6}K^{-1}$.

Figure 1D:
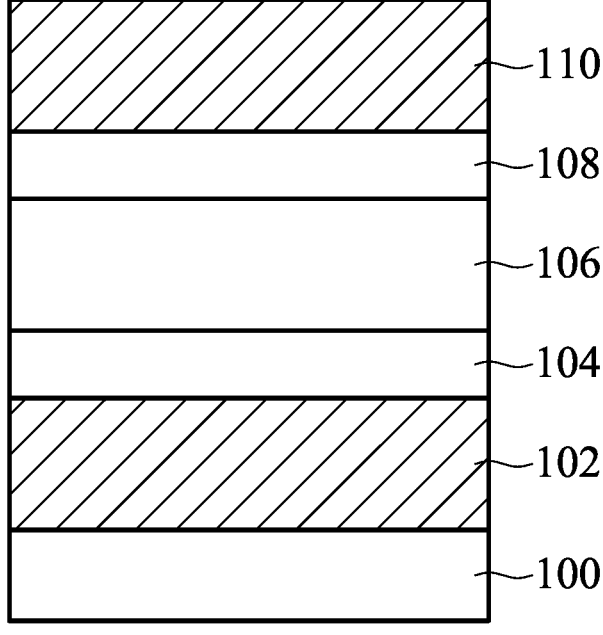

As shown in FIG. 1D, a top electrode 110 is formed over the carbon-containing layer 108, in accordance with some embodiments. The material and formation method of the top electrode 110 may be the same as or similar to those of the bottom electrode 102. In some embodiments, the top electrode 110 is in direct contact with the carbon-containing layer 108.

Figure 1E:
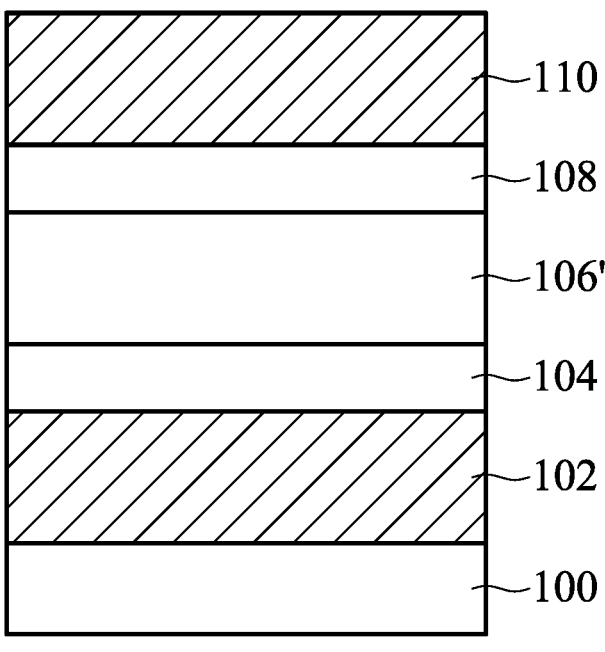

As shown in FIG. 1E, the ferroelectric layer 106 is crystallized to form a crystallized ferroelectric layer 106', in accordance with some embodiments. In some embodiments, the ferroelectric layer 106 is made of hafnium zirconium oxide. After the crystallization, the crystallized ferroelectric layer 106' has a non-centrosymmetric polar orthorhombic phase. In some embodiments, the device structure shown in FIG. 1E functions as a ferroelectric tunnel junction (FTJ) memory device.

In some embodiments, the crystallization of the ferroelectric layer 106 involves thermally annealing the ferroelectric layer 106. In some embodiments, the ferroelectric layer 106 and the carbon-containing layers 104 and 108 are annealed simultaneously to form the crystallized ferroelectric layer 106'.

The annealing temperature may be within a range from about 150 degrees C. to about 900 degrees C. The annealing atmosphere gas may include $N_2$, Ar, $N_2H_2$, $O_2$, $H_2O$, He, one or more other suitable gases, or a combination thereof. The annealing time may be within a range from about 1 second to about 6 hours.

As mentioned above, in some embodiments, the carbon-containing layers 104 and 108 have a low coefficient of thermal expansion. During the cooling step following the annealing process, the carbon-containing layers 104 and 108 may function as stress layers that induce in-plane tensile strain to the ferroelectric layer 106. The constraint of the carbon-containing layers 104 and 108 may facilitate to the growth of the orthorhombic phase of the crystallized ferroelectric layer 106'. The remnant polarization and the endurance of the crystallized ferroelectric layer 106' may be improved.

Figure 2A:
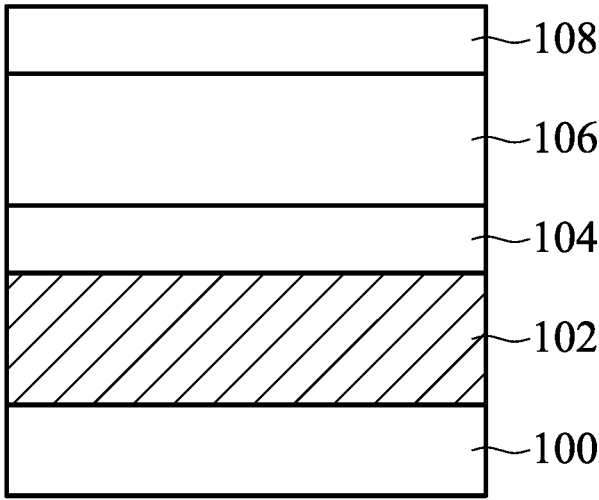
FIGS. 2A-2C are cross-sectional views of various stages of a process for forming a portion of a device structure, in accordance with some embodiments.
Figure 2B:
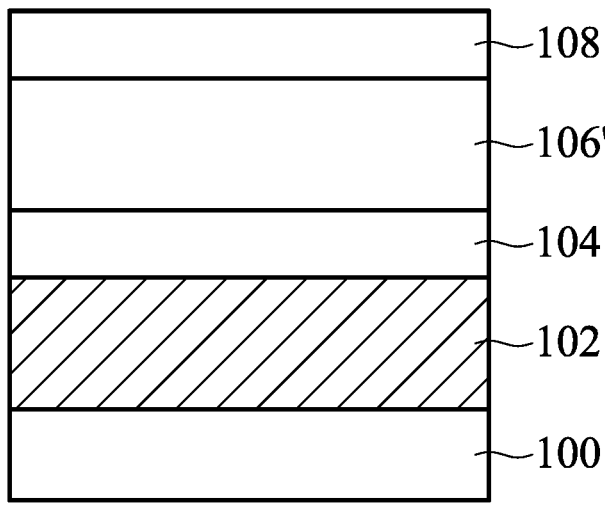
Figure 2C:
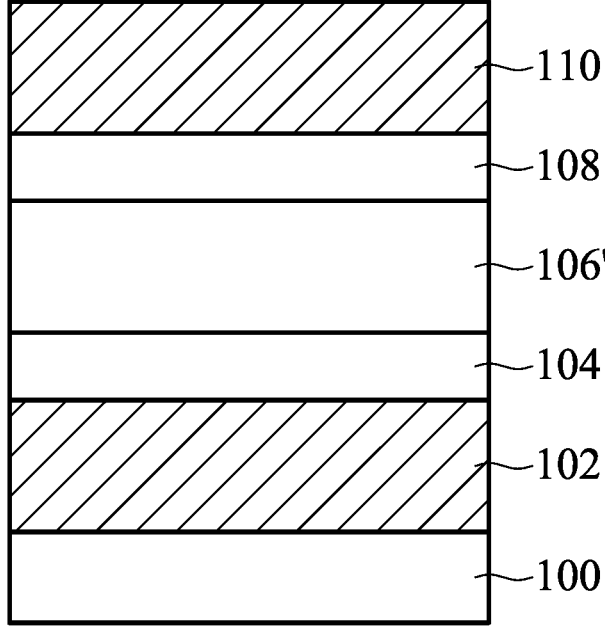

Many variations and/or modifications can be made to embodiments of the disclosure. FIGS. 2A-2C are cross-sectional views of various stages of a process for forming a portion of a device structure, in accordance with some embodiments. As shown in FIG. 2A, a structure that is the same as or similar to the structure shown in FIG. 1C is formed.

As shown in FIG. 2B, the ferroelectric layer 106 is crystallized to form the crystallized ferroelectric layer 106', in accordance with some embodiments. In some embodiments, the crystallization of the ferroelectric layer 106 involves thermally annealing the ferroelectric layer 106. In some embodiments, the ferroelectric layer 106 and the carbon-containing layers 104 and 108 are annealed simultaneously to form the crystallized ferroelectric layer 106'.

The annealing temperature may be within a range from about 150 degrees C. to about 900 degrees C. The annealing atmosphere gas may include $N_2$, Ar, $N_2H_2$, $O_2$, $H_2O$, He, one or more other suitable gases, or a combination thereof. The annealing time may be within a range from about 1 second to about 6 hours.

Afterwards, a top electrode 110 is formed over the carbon-containing layer 108, as shown in FIG. 2C in accordance with some embodiments. The material and formation method of the top electrode 110 may be the same as or similar to those of the top electrode 110 illustrated in FIG. 1D.

Figure 3A:
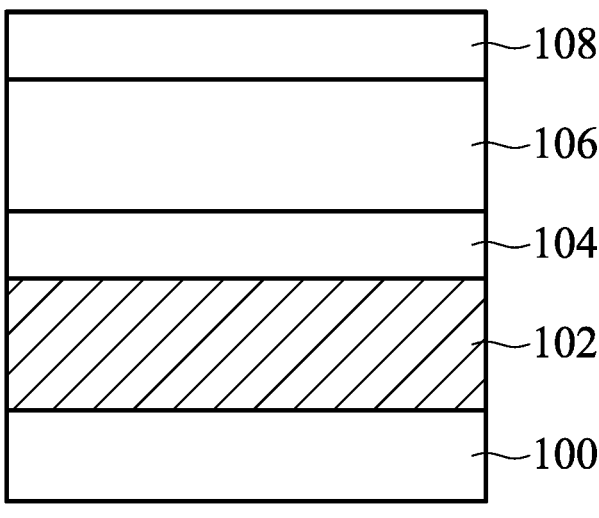
FIGS. 3A-3D are cross-sectional views of various stages of a process for forming a portion of a device structure, in accordance with some embodiments.
Figure 3B:
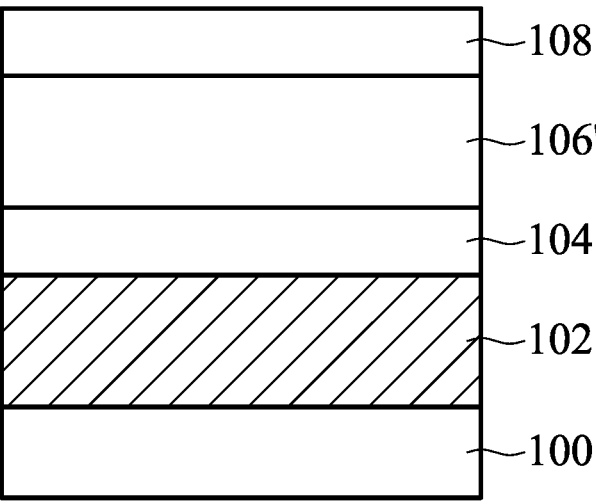

Many variations and/or modifications can be made to embodiments of the disclosure. FIGS. 3A-3D are cross-sectional views of various stages of a process for forming a portion of a device structure, in accordance with some embodiments. As shown in FIG. 3A, a structure that is the same as or similar to the structure shown in FIG. 1C is formed. Afterwards, as shown in FIG. 3B, similar to the embodiments illustrated in FIG. 2B, the ferroelectric layer 106 is crystallized to form the crystallized ferroelectric layer 106', in accordance with some embodiments.

Figure 3C:
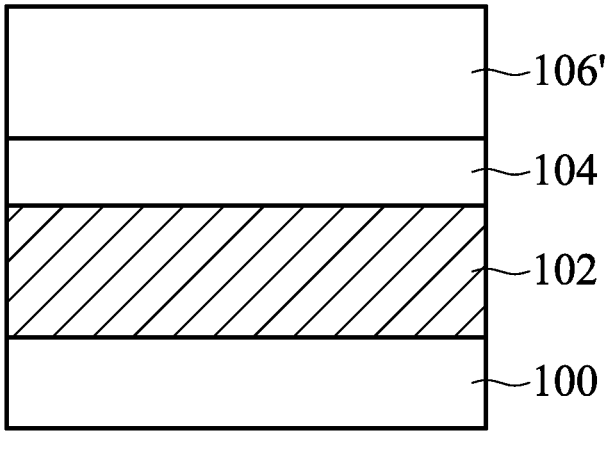

As shown in FIG. 3C, the carbon-containing layer 108 is removed after the formation of the crystallized ferroelectric layer 106', in accordance with some embodiments. As a result, the crystallized ferroelectric layer 106' is exposed. One or more etching processes may be used to remove the carbon-containing layer 108.

Figure 3D:
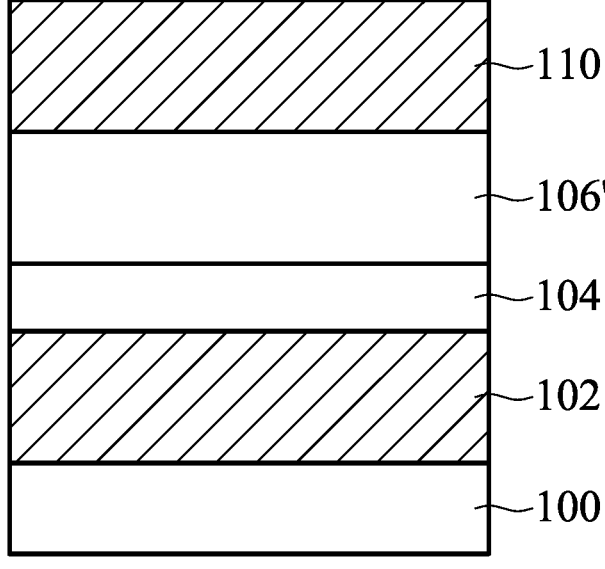

As shown in FIG. 3D, a top electrode 110 is formed over the crystallized ferroelectric layer 106', in accordance with some embodiments. The material and formation method of the top electrode 110 may be the same as or similar to those of the top electrode 110 illustrated in FIG. 1D. In some embodiments, the top electrode 110 is in direct contact with the crystallized ferroelectric layer 106'.

Figure 4A:
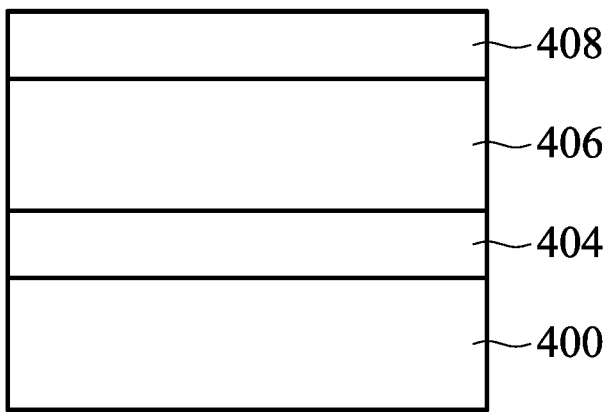
FIGS. 4A-4E are cross-sectional views of various stages of a process for forming a portion of a device structure, in accordance with some embodiments.

Many variations and/or modifications can be made to embodiments of the disclosure. FIGS. 4A-4E are cross-sectional views of various stages of a process for forming a portion of a device structure, in accordance with some embodiments. As shown in FIG. 4A, a substrate 400 is provided and received. The substrate 400 may be the same as or similar to the substrate 100 illustrated in FIG. 1A.

Afterwards, a carbon-containing layer 404 is formed over the substrate 400, as shown in FIG. 4A in accordance with some embodiments. In some embodiments, the carbon-containing layer 404 is a pure carbon layer. In some embodiments, the carbon-containing layer 404 is amorphous. The thickness of the carbon-containing layer 404 may be within a range from about 2 angstroms to about 10 nm. In some embodiments, the carbon-containing layer 404 has a lower coefficient of thermal expansion (CTE) than that of the bottom electrode 102. The CTE of the carbon-containing layer 404 may be within a range from about $10^{-7}K^{-1}$ to about $10^{-6}K^{-1}$.

The carbon-containing layer 404 may be deposited using a CVD process, an atomic layer deposition (ALD) process, a plasma enhanced chemical vapor deposition (PECVD) process, a plasma enhanced atomic layer deposition (PEALD) process, a PVD process, a molecular beam epitaxy process (MBE), one or more other applicable processes, or a combination thereof. The precursor gases used for forming the carbon-containing layer 404 may include one or more halogen- and carbon-containing gases and hydrogen. The formation of the carbon-containing layer 404 may further involve one or more patterning processes.

As shown in FIG. 4A, a ferroelectric layer 406 is then formed over the carbon-containing layer 404, in accordance with some embodiments. In some embodiments, the ferroelectric layer 406 is in direct contact with the carbon-containing layer 404. In some embodiments, the ferroelectric layer 406 is a hafnium-containing oxide layer. For example, the ferroelectric layer 406 is made of hafnium zirconium oxide (HZO). The atomic concentration of hafnium of the ferroelectric layer 406 may be within a range from about 30% to about 75%. In some embodiments, the ferroelectric layer 406 is amorphous.

The ferroelectric layer 406 may be deposited using an ALD process, a CVD process, one or more other applicable processes, or a combination thereof. The precursor gases used for forming the ferroelectric layer 406 may include a hafnium-containing gas such as hafnium chloride, dimethylamido hafnium, one or more other suitable precursors, or a combination thereof. The precursor gases used for forming the ferroelectric layer 406 may also include a zirconium-containing gas such as zirconium chloride, dimethylamido zirconium, one or more other suitable precursors, or a combination thereof. The precursor gases used for forming the ferroelectric layer 406 may further include oxidant such as oxygen, ozone, water, hydrogen peroxide, one or more other suitable oxidants, or a combination thereof. The formation of the ferroelectric layer 406 may further involve one or more patterning processes.

Afterwards, a carbon-containing layer 408 is formed over the ferroelectric layer 406, as shown in FIG. 4A in accordance with some embodiments. In some embodiments, the carbon-containing layer 408 is in direct contact with the ferroelectric layer 406. In some embodiments, the material and formation method of the carbon-containing layer 408 are the same as or similar to those of the carbon-containing layer 104. In some embodiments, the carbon-containing layer 408 is amorphous. The thickness of the carbon-containing layer 408 may be within a range from about 2 angstroms to about 10 nm. In some embodiments, the carbon-containing layer 408 has a lower coefficient of thermal expansion (CTE) than that of the ferroelectric layer 106. The CTE of the carbon-containing layer 408 may be within a range from about $10^{-7}K^{-1}$ to about $10^{-6}K^{-1}$.

Figure 4B:
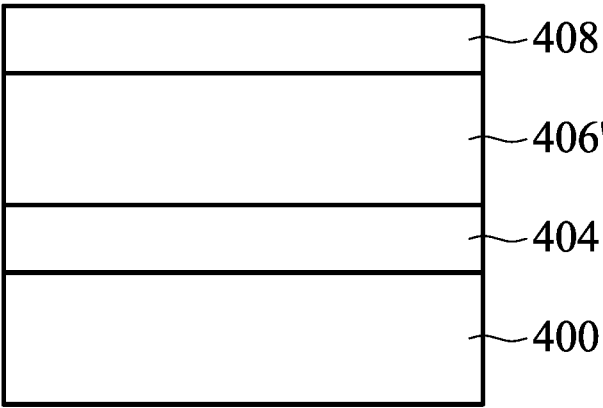

As shown in FIG. 4B, the ferroelectric layer 406 is crystallized to form a crystallized ferroelectric layer 406', in accordance with some embodiments. In some embodiments, the ferroelectric layer 406 is made of hafnium zirconium oxide. After the crystallization, the crystallized ferroelectric layer 406' has a non-centrosymmetric polar orthorhombic phase. In some embodiments, the crystallization of the ferroelectric layer 406 involves thermally annealing the ferroelectric layer 406. In some embodiments, the ferroelectric layer 406 and the carbon-containing layers 404 and 408 are annealed simultaneously to form the crystallized ferroelectric layer 406'.

The annealing temperature may be within a range from about 150 degrees C. to about 900 degrees C. The annealing atmosphere gas may include $N_2$, Ar, $N_2H_2$, $O_2$, $H_2O$, He, one or more other suitable gases, or a combination thereof. The annealing time may be within a range from about 1 second to about 6 hours.

As mentioned above, in some embodiments, the carbon-containing layers 104 and 108 have a low coefficient of thermal expansion. During the cooling step following the annealing process, the carbon-containing layers 404 and 408 may function as stress layers that induce in-plane tensile strain to the ferroelectric layer 406. Under the constraint of the carbon-containing layers 404 and 408, the growth of the orthorhombic phase of the crystallized ferroelectric layer 406' may be facilitated.

Figure 4C:
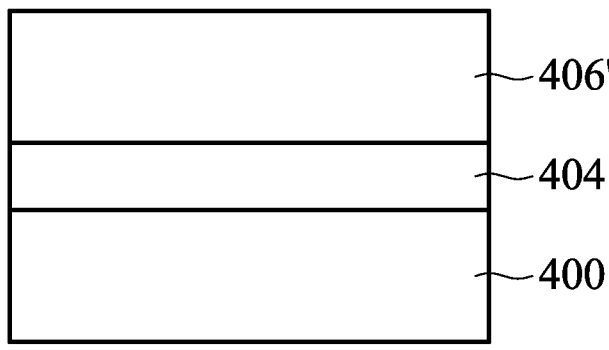

As shown in FIG. 4C, the carbon-containing layer 408 is removed after the formation of the crystallized ferroelectric layer 406', in accordance with some embodiments. As a result, the crystallized ferroelectric layer 406' is exposed. One or more etching processes may be used to remove the carbon-containing layer 408.

Figure 4D:
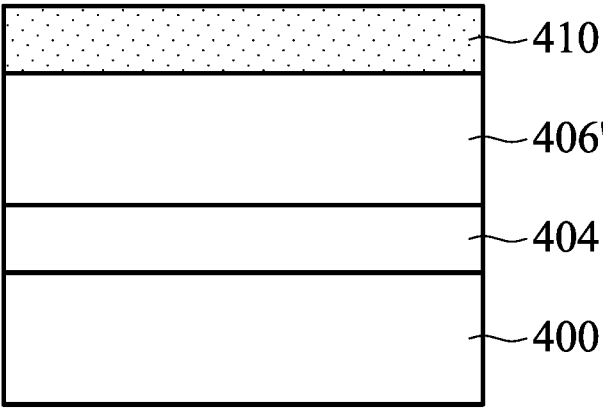

As shown in FIG. 4D, a channel layer 410 is formed over the crystallized ferroelectric layer 406', in accordance with some embodiments. In some embodiments, the channel layer 410 is an oxide semiconductor layer. In some embodiments, the channel layer 410 is in direct contact with the crystallized ferroelectric layer 406'.

The channel layer 410 may be made of or include an n-type semiconductor material such as indium gallium zinc oxide (IGZO), indium zinc oxide (IZO), indium oxide (InO), indium tin oxide (ITO), indium tungsten oxide (IWO), one or more other suitable materials, or a combination thereof. Alternatively, the channel layer 410 may be made of or include a p-type semiconductor material such as copper oxide (CuO), nickel oxide (NiO), tin oxide (SnO), one or more other suitable materials, or a combination thereof. The channel layer 410 may be deposited using a CVD process, an ALD process, one or more other applicable processes, or a combination thereof. The formation of the channel layer 410 may further include one or more patterning processes.

Figure 4E:
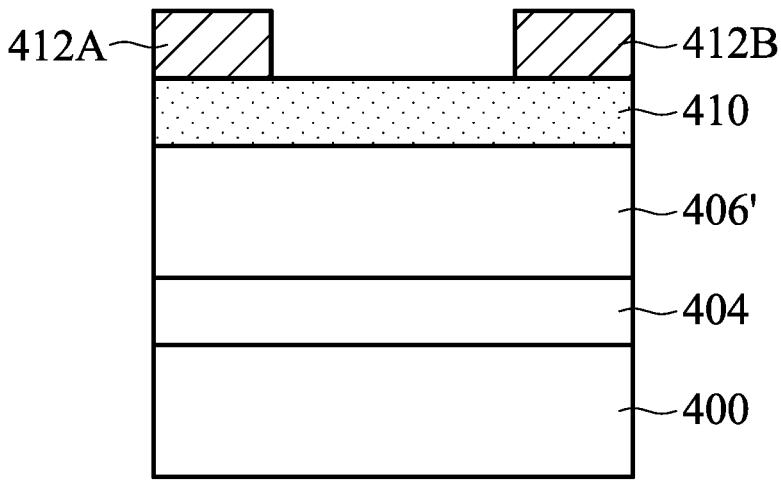

As shown in FIG. 4E, source/drain electrodes 412A and 412B are formed, in accordance with some embodiments. The source/drain electrodes 412A and 412B are electrically connected to the channel layer 410. In some embodiments, the source/drain electrodes 412A and 412B are made of one or more metal materials. The formation of the source/drain electrodes 412A and 412B may include one or more deposition processes and one or more patterning processes. In some embodiments, the device structure shown in FIG. 4E functions as a back-gated ferroelectric thin film transistor (Fe-TFT). The crystallized ferroelectric layer 406' may function as a gate dielectric layer, and the carbon-containing layer 404 may function as a gate electrode.

Figure 5A:
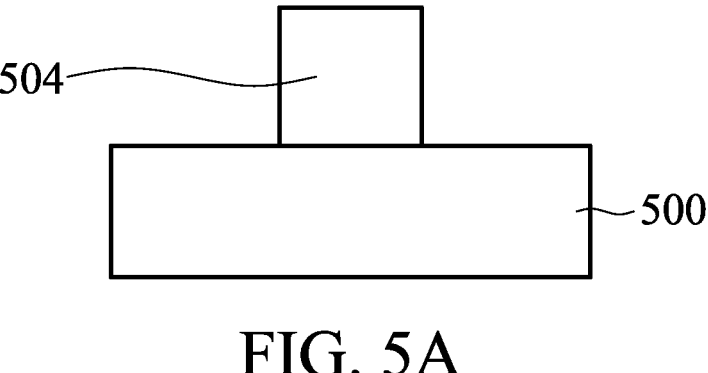
FIGS. 5A-5F are cross-sectional views of various stages of a process for forming a portion of a device structure, in accordance with some embodiments.

Many variations and/or modifications can be made to embodiments of the disclosure. FIGS. 5A-5F are cross-sectional views of various stages of a process for forming a portion of a device structure, in accordance with some embodiments. As shown in FIG. 5A, a substrate 500 is provided or received. The substrate 500 may be the same as or similar to the substrate 400 illustrated in FIG. 4A.

Afterwards, a carbon-containing strip 504 is formed over the substrate 500, as shown in FIG. 5A in accordance with some embodiments. In some embodiments, a carbon-containing layer is deposited over the substrate 500. Afterwards, the carbon-containing layer is patterned to form the carbon-containing strip 504. The material and formation method of the carbon-containing layer may be the same as or similar to those of the carbon-containing layer 404 as illustrated in FIG. 4A. After partially removing the carbon-containing layer, the remaining portion of the carbon-containing layer forms the carbon-containing strip 504. The carbon-containing strip 504 may function as the gate electrode of a three-dimensional thin film transistor (3D TFT).

Figure 5B:
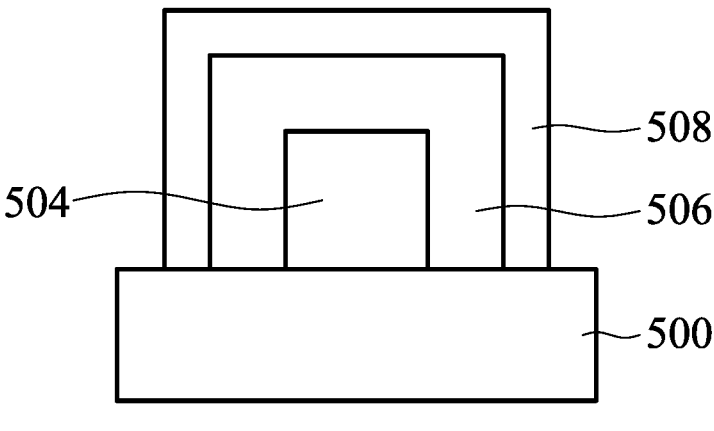

As shown in FIG. 5B, a ferroelectric layer 506 is deposited over the carbon-containing strip 504 and the substrate 500, in accordance with some embodiments. The material and formation method of the ferroelectric layer 506 may be the same as or similar to those of the ferroelectric layer 406 as illustrated in FIG. 4A. In some embodiments, the ferroelectric layer 506 is in direct contact with the carbon-containing strip 504.

In some embodiments, the ferroelectric layer 506 is then patterned. One or more photolithography processes and one or more etching processes may be used to partially remove the ferroelectric layer 506. In some embodiments, the remaining portion of the ferroelectric layer 506 extends along the top and sidewalls of the carbon-containing strip 504. In some embodiments, in a top view, the remaining portion of the ferroelectric layer 506 partially covers the carbon-containing strip 504.

Afterwards, a carbon-containing layer 508 is deposited over the ferroelectric layer 506, as shown in FIG. 5B in accordance with some embodiments. The material and formation method of the ferroelectric layer 508 may be the same as or similar to those of the ferroelectric layer 408 as illustrated in FIG. 4A. In some embodiments, the carbon-containing layer 508 is in direct contact with the ferroelectric layer 506. In some embodiments, the carbon-containing layer 508 covers the ferroelectric layer 506.

Figure 5C:
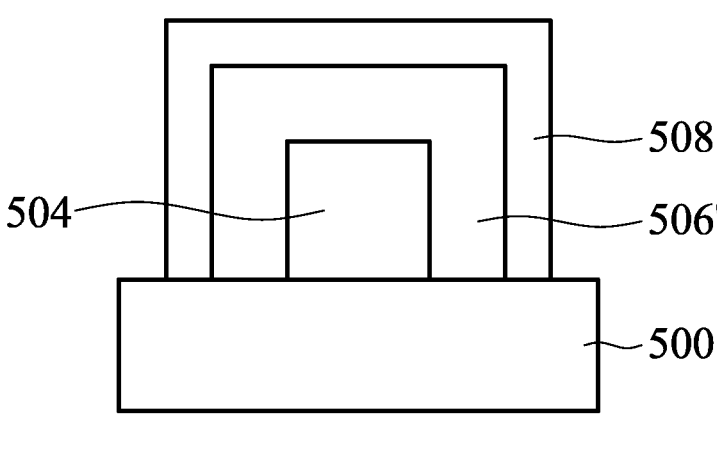

As shown in FIG. 5C, the ferroelectric layer 506 is crystallized to form a crystallized ferroelectric layer 506', in accordance with some embodiments. In some embodiments, the ferroelectric layer 506 is made of hafnium zirconium oxide. After the crystallization, the crystallized ferroelectric layer 506' has a non-centrosymmetric polar orthorhombic phase. In some embodiments, the crystallization of the ferroelectric layer 506 involves thermally annealing the ferroelectric layer 506. In some embodiments, the ferroelectric layer 506, the carbon-containing strip 504, and the carbon-containing layer 508 are annealed simultaneously to form the crystallized ferroelectric layer 506'.

The annealing temperature may be within a range from about 150 degrees C. to about 900 degrees C. The annealing atmosphere gas may include $N_2$, Ar, $N_2H_2$, $O_2$, $H_2O$, He, one or more other suitable gases, or a combination thereof. The annealing time may be within a range from about 1 second to about 6 hours.

In some embodiments, the carbon-containing strip 504 and the carbon-containing layer 508 have a low coefficient of thermal expansion. During the cooling step following the annealing process, the carbon-containing strip 504 and the carbon-containing layer 508 may function as stress layers that induce in-plane tensile strain to the ferroelectric layer 506. Under the constraint of the carbon-containing strip 504 and the carbon-containing layer 508, the growth of the orthorhombic phase of the crystallized ferroelectric layer 506' may be facilitated.

Figure 5D:
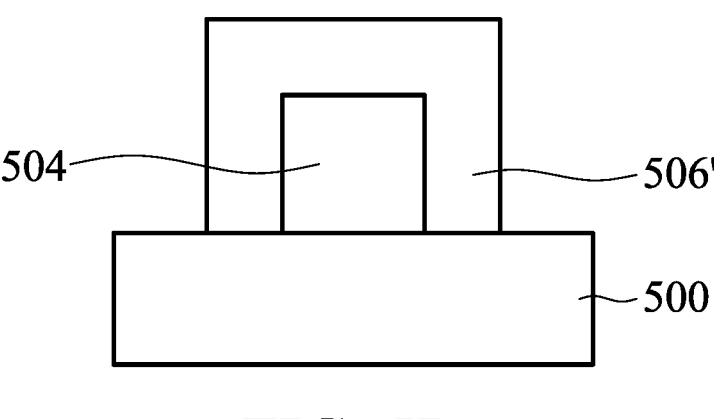

As shown in FIG. 5D, the carbon-containing layer 508 is removed after the formation of the crystallized ferroelectric layer 506', in accordance with some embodiments. As a result, the crystallized ferroelectric layer 506' is exposed. One or more etching processes may be used to remove the carbon-containing layer 508.

Figure 5E:
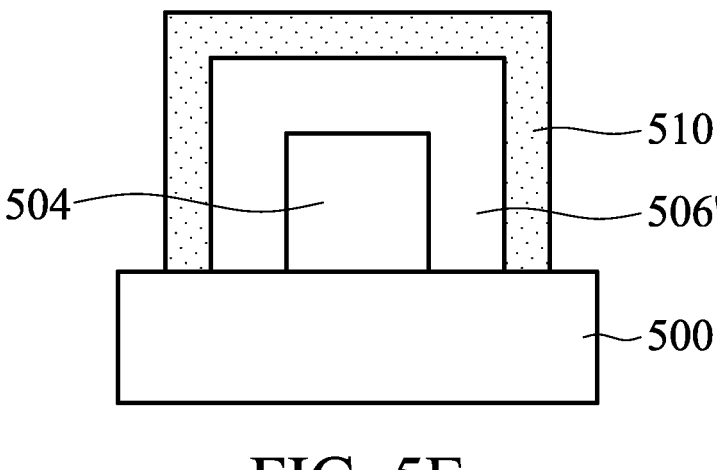

As shown in FIG. 5E, a channel layer 510 is formed over the crystallized ferroelectric layer 506', in accordance with some embodiments. In some embodiments, the channel layer 510 is an oxide semiconductor layer. In some embodiments, the channel layer 510 is in direct contact with the crystallized ferroelectric layer 506'.

The channel layer 510 may be made of or include an n-type semiconductor material such as indium gallium zinc oxide (IGZO), indium zinc oxide (IZO), indium oxide (InO), indium tin oxide (ITO), indium tungsten oxide (IWO), one or more other suitable materials, or a combination thereof. Alternatively, the channel layer 510 may be made of or include a p-type semiconductor material such as copper oxide (CuO), nickel oxide (NiO), tin oxide (SnO), one or more other suitable materials, or a combination thereof.

The channel layer 510 may be deposited using a CVD process, an ALD process, one or more other applicable processes, or a combination thereof. The formation of the channel layer 510 may further include one or more patterning processes. In some embodiments, in a top view, the channel layer 510 partially covers the crystallized ferroelectric layer 506' and the carbon-containing strip 504.

Figure 5F:
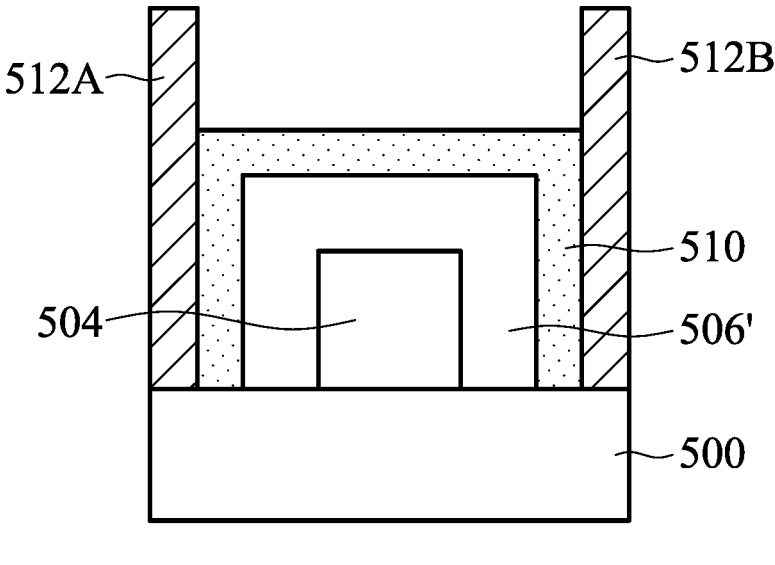

As shown in FIG. 5F, source/drain electrodes 512A and 512B are formed, in accordance with some embodiments. The source/drain electrodes 512A and 512B are electrically connected to the channel layer 510. In some embodiments, the source/drain electrodes 512A and 512B are made of one or more metal materials. The formation of the source/drain electrodes 512A and 512B may include one or more deposition processes and one or more patterning processes. In some embodiments, the device structure shown in FIG. 5F functions as a three-dimensional thin film transistor (3D TFT). The crystallized ferroelectric layer 506' may function as a gate dielectric layer, and the carbon-containing strip 504 may function as a gate electrode.

Figure 6:
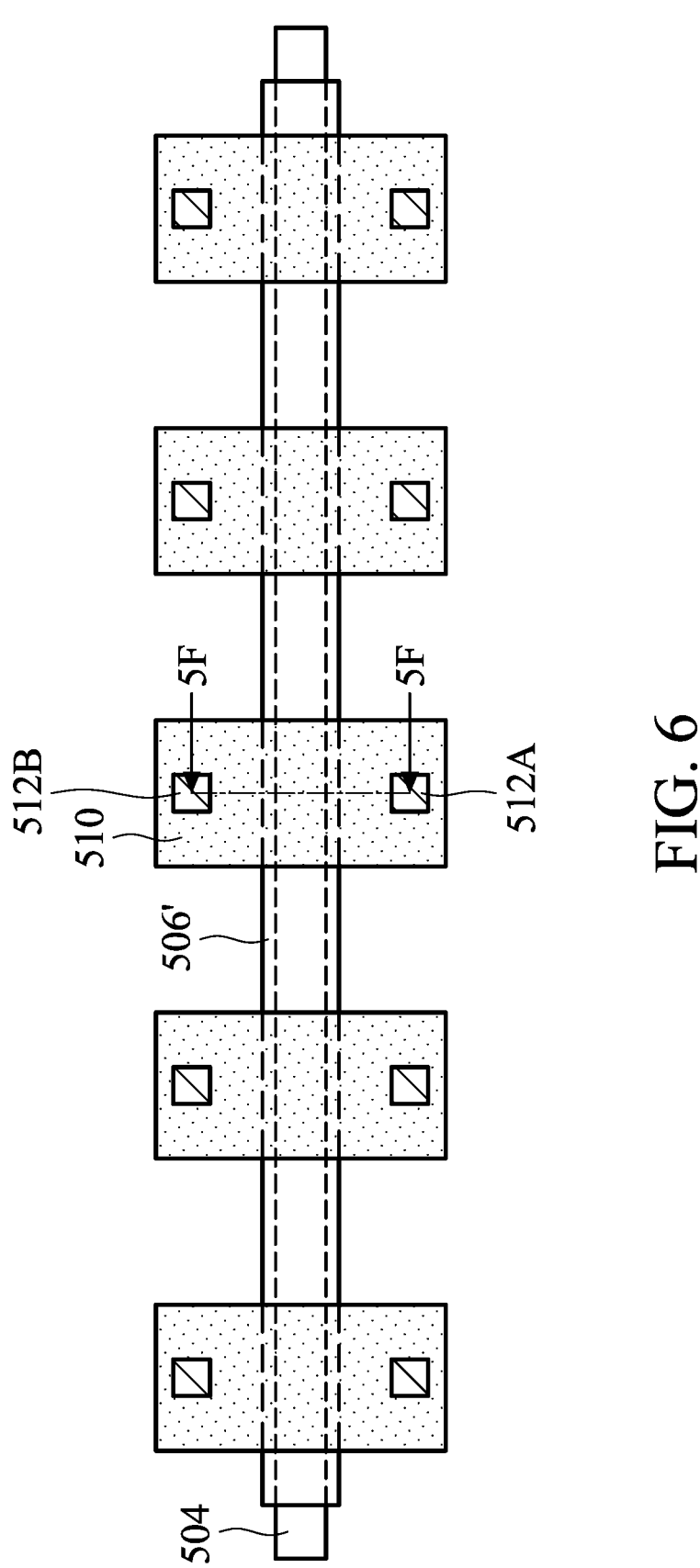
FIG. 6 is a top view of an intermediate stage of a process for forming a portion of a device structure, in accordance with some embodiments.

FIG. 6 is a top view of an intermediate stage of a process for forming a portion of a device structure, in accordance with some embodiments. In some embodiments, FIG. 5F is a cross-sectional view of the structure taken along the line 5F-5F in FIG. 6.

In some embodiments, multiple channel layers 510 are formed to partially cover the crystallized ferroelectric layer 506' and the carbon-containing strip 504, as shown in FIG. 6. In some embodiments, multiple electrodes are formed to provide electrical connections to the channel layers 510.

Figure 7A:
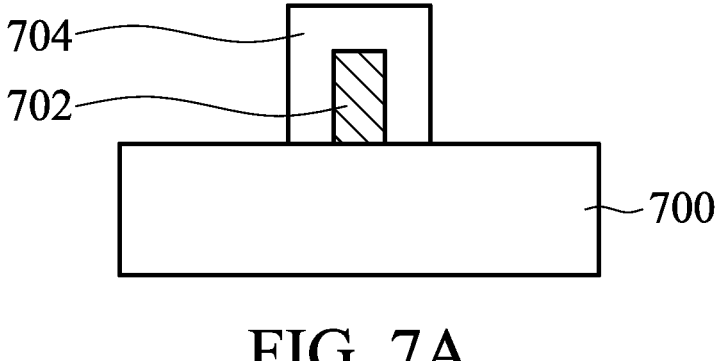
FIGS. 7A-7F are cross-sectional views of various stages of a process for forming a portion of a device structure, in accordance with some embodiments.

Many variations and/or modifications can be made to embodiments of the disclosure. FIGS. 7A-7F are cross-sectional views of various stages of a process for forming a portion of a device structure, in accordance with some embodiments. As shown in FIG. 7A, a substrate 700 is provided or received. The substrate 700 may be the same as or similar to the substrate 400 illustrated in FIG. 4A.

Afterwards, a metal gate strip 702 is formed over the substrate 700, as shown in FIG. 7A in accordance with some embodiments. The metal gate strip 702 may be made of or include tungsten (W), titanium nitride (TiN), ruthenium (Ru), one or more other suitable materials, or a combination thereof. In some embodiments, a metal-containing layer is deposited over the substrate 700. The metal-containing layer may be deposited using a PVD process, a CVD process, an ALD process, an electroplating process, an electrochemical deposition process, one or more other applicable processes, or a combination thereof. Afterwards, the metal-containing layer is patterned to form the metal gate strip 702. One or more photolithography processes and one or more etching processes may be used to pattern the metal-containing layer. After the partial removal of the metal-containing layer, the remaining portion of the metal layer forms the metal gate strip 702. The metal gate strip 702 may function as the gate electrode of a three-dimensional thin film transistor (3D TFT).

As shown in FIG. 7A, a carbon-containing layer 704 is then deposited over the metal gate strip 702 and the substrate 700, in accordance with some embodiments. The material and formation method of the carbon-containing layer 704 may be the same as or similar to those of the carbon-containing layer 404 as illustrated in FIG. 4A. In some embodiments, the carbon-containing layer 704 is in direct contact with the metal gate strip 702.

In some embodiments, the carbon-containing layer 704 is then patterned. One or more photolithography processes and one or more etching processes may be used to partially remove the carbon-containing layer 704. In some embodiments, the remaining portion of the carbon-containing layer 704 extends along the top and sidewalls of the metal gate strip 702. In some embodiments, in a top view, the remaining portion of the carbon-containing layer 704 partially covers the metal gate strip 702.

Figure 7B:
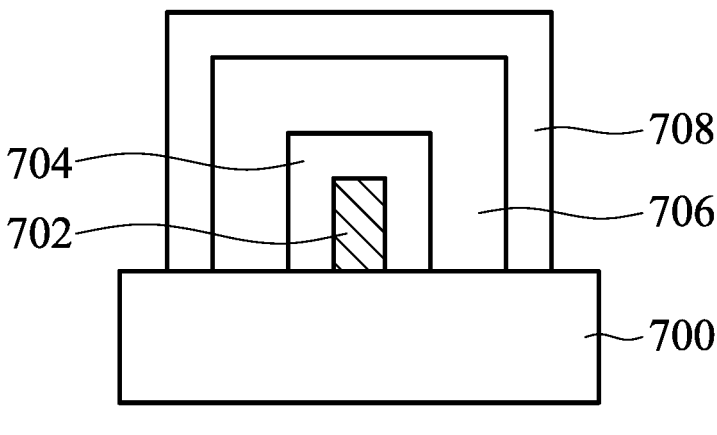

As shown in FIG. 7B, a ferroelectric layer 706 is deposited over the carbon-containing layer 704 and the substrate 700, in accordance with some embodiments. The material and formation method of the ferroelectric layer 706 may be the same as or similar to those of the ferroelectric layer 406 as illustrated in FIG. 4A. In some embodiments, the ferroelectric layer 706 is in direct contact with the carbon-containing layer 704.

In some embodiments, the ferroelectric layer 706 is then patterned. One or more photolithography processes and one or more etching processes may be used to partially remove the ferroelectric layer 706. In some embodiments, in a top view, the remaining portion of the ferroelectric layer 706 partially covers the carbon-containing layer 704.

Afterwards, a carbon-containing layer 708 is deposited over the ferroelectric layer 706, as shown in FIG. 7B in accordance with some embodiments. The material and formation method of the ferroelectric layer 708 may be the same as or similar to those of the ferroelectric layer 408 as illustrated in FIG. 4A. In some embodiments, the carbon-containing layer 708 is in direct contact with the ferroelectric layer 706. In some embodiments, the carbon-containing layer 708 covers the ferroelectric layer 706.

Figures 7C, 7D:
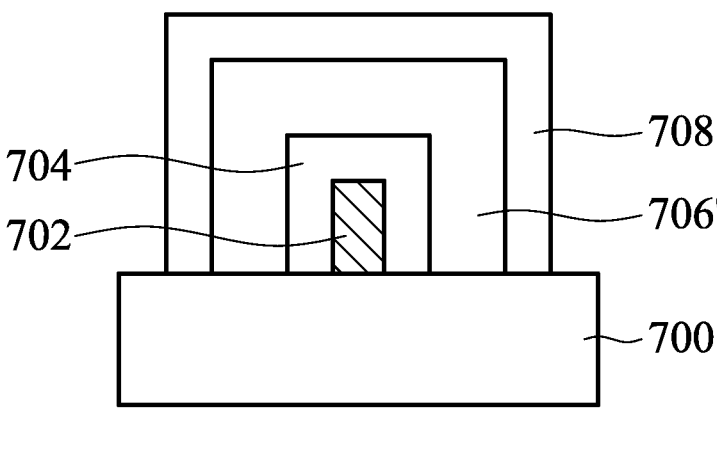

As shown in FIG. 7C, the ferroelectric layer 706 is crystallized to form a crystallized ferroelectric layer 706', in accordance with some embodiments. In some embodiments, the ferroelectric layer 706 is made of hafnium zirconium oxide. After the crystallization, the crystallized ferroelectric layer 706' has a non-centrosymmetric polar orthorhombic phase. In some embodiments, the crystallization of the ferroelectric layer 706 involves thermally annealing the ferroelectric layer 706. In some embodiments, the ferroelectric layer 706, the carbon-containing layer 704, and the carbon-containing layer 708 are annealed simultaneously to form the crystallized ferroelectric layer 706'.

The annealing temperature may be within a range from about 150 degrees C. to about 900 degrees C. The annealing atmosphere gas may include $N_2$, Ar, $N_2H_2$, $O_2$, $H_2O$, He, one or more other suitable gases, or a combination thereof. The annealing time may be within a range from about 1 second to about 6 hours.

In some embodiments, the carbon-containing layer 704 and the carbon-containing layer 708 have a low coefficient of thermal expansion. During the cooling step following the annealing process, the carbon-containing layer 704 and the carbon-containing layer 708 may function as stress layers that induce in-plane tensile strain to the ferroelectric layer 706. Under the constraint of the carbon-containing layer 704 and the carbon-containing layer 708, the growth of the orthorhombic phase of the crystallized ferroelectric layer 706' may be facilitated.

As shown in FIG. 7D, the carbon-containing layer 708 is removed after the formation of the crystallized ferroelectric layer 706', in accordance with some embodiments. As a result, the crystallized ferroelectric layer 706' is exposed. One or more etching processes may be used to remove the carbon-containing layer 708.

Figures 7E, 7F:
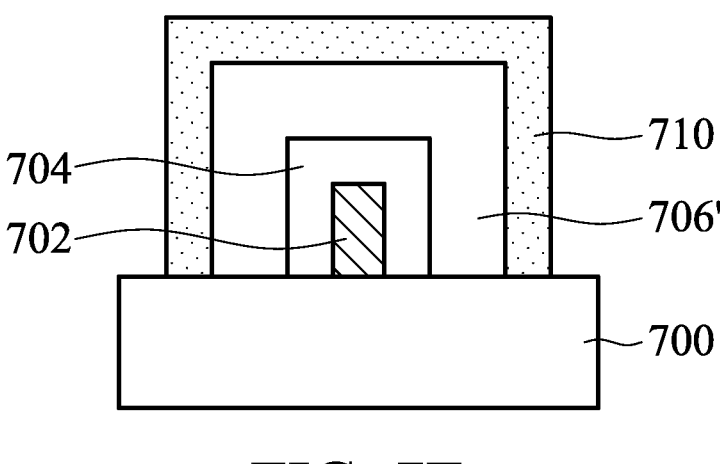

As shown in FIG. 7E, a channel layer 710 is formed over the crystallized ferroelectric layer 706', in accordance with some embodiments. In some embodiments, the channel layer 710 is an oxide semiconductor layer. In some embodiments, the channel layer 710 is in direct contact with the crystallized ferroelectric layer 706'.

The channel layer 710 may be made of or include an n-type semiconductor material such as indium gallium zinc oxide (IGZO), indium zinc oxide (IZO), indium oxide (InO), indium tin oxide (ITO), indium tungsten oxide (IWO), one or more other suitable materials, or a combination thereof. Alternatively, the channel layer 710 may be made of or include a p-type semiconductor material such as copper oxide (CuO), nickel oxide (NiO), tin oxide (SnO), one or more other suitable materials, or a combination thereof.

The channel layer 710 may be deposited using a CVD process, an ALD process, one or more other applicable processes, or a combination thereof. The formation of the channel layer 710 may further include one or more patterning processes. In some embodiments, in a top view, the channel layer 710 partially covers the crystallized ferroelectric layer 706' and the carbon-containing layer 704.

As shown in FIG. 7F, source/drain electrodes 712A and 712B are formed, in accordance with some embodiments. The source/drain electrodes 712A and 712B are electrically connected to the channel layer 710. In some embodiments, the source/drain electrodes 712A and 712B are made of one or more metal materials. The formation of the source/drain electrodes 712A and 712B may include one or more deposition processes and one or more patterning processes. In some embodiments, the device structure shown in FIG. 7F functions as a three-dimensional thin film transistor (3D TFT).

Embodiments of the disclosure form a device structure with a crystallized ferroelectric layer. Two carbon-containing stressor layers are used to assist in the growth of the crystallized ferroelectric layer. The carbon-containing stressor layers are formed to sandwich an amorphous ferroelectric layer. Afterwards, a thermal annealing process is performed to initiate the crystallization of the amorphous ferroelectric layer. During the cooling step following the annealing process, the carbon-containing stressor layers may induce in-plane tensile strain to the ferroelectric layer. The constraint of the carbon-containing layers may facilitate to the growth of the orthorhombic phase of the crystallized ferroelectric layer. The remnant polarization and the endurance of the crystallized ferroelectric layer may be improved. The performance and reliability of the device structure are therefore improved.

In accordance with some embodiments, a method for forming a device structure is provided. The method includes forming a first carbon-containing layer over a substrate and forming a hafnium-containing oxide layer over the first carbon-containing layer. The method also includes forming a second carbon-containing layer over the hafnium-containing oxide layer. The method further includes crystallizing the hafnium-containing oxide layer while the hafnium-containing oxide layer is between the first carbon-containing layer and the second carbon-containing layer.

In accordance with some embodiments, a method for forming a device structure is provided. The method includes forming a carbon-containing layer over a substrate. The method also includes forming a ferroelectric layer over the carbon-containing layer. The method further includes crystallizing the ferroelectric layer by simultaneously annealing the ferroelectric layer and the carbon-containing layer.

In accordance with some embodiments, a device structure is provided. The device structure includes a substrate and a carbon-containing layer over the substrate. The device structure also includes a crystallized ferroelectric layer over the carbon-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a device structure, comprising:
forming a first carbon-containing layer over a substrate;
forming a hafnium-containing oxide layer over the first carbon-containing layer;
forming a second carbon-containing layer over the hafnium-containing oxide layer;

crystallizing the hafnium-containing oxide layer while the hafnium-containing oxide layer is between the first carbon-containing layer and the second carbon-containing layer; and
removing the second carbon-containing layer to expose a top surface of the hafnium-containing oxide layer after the hafnium-containing oxide layer is crystallized.

2. The method for forming a device structure as claimed in claim 1, further comprising:
forming a bottom electrode over the substrate, wherein the bottom electrode is between the first carbon-containing layer and the substrate; and
forming a top electrode over the second carbon-containing layer after the hafnium-containing oxide layer is crystallized.

3. The method for forming a device structure as claimed in claim 1, further comprising:
forming a bottom electrode over the substrate, wherein the bottom electrode is between the first carbon-containing layer and the substrate; and
forming a top electrode over the hafnium-containing oxide layer after the second carbon-containing layer is removed.

4. The method for forming a device structure as claimed in claim 1, further comprising:
forming a channel layer over the hafnium-containing oxide layer after the second carbon-containing layer is removed; and
forming source/drain electrodes electrically connected to the channel layer.

5. The method for forming a device structure as claimed in claim 1, further comprising:
patterning the first carbon-containing layer into a carbon-containing strip before the hafnium-containing oxide layer is formed, wherein the hafnium-containing oxide layer is formed along sidewalls and a top of the carbon-containing strip;
forming a channel layer over the hafnium-containing oxide layer after the second carbon-containing layer is removed; and
forming source/drain electrodes electrically connected to the channel layer.

6. The method for forming a device structure as claimed in claim 5, wherein the channel layer partially covers the hafnium-containing oxide layer.

7. The method for forming a device structure as claimed in claim 1, further comprising:
forming a metal gate over the substrate before the first carbon-containing layer is formed, wherein the first carbon-containing layer extends along sidewalls and a top of the metal gate;
forming a channel layer over the hafnium-containing oxide layer after the second carbon-containing layer is removed; and
forming source/drain electrodes electrically connected to the channel layer.

8. The method for forming a device structure as claimed in claim 1, wherein the crystallizing the hafnium-containing oxide layer involves thermally annealing the first carbon-containing layer, the hafnium-containing oxide layer, and the second carbon-containing layer.

9. The method for forming a device structure as claimed in claim 1, wherein the first carbon-containing layer and the second carbon-containing layer are amorphous carbon layers.

10. A method for forming a device structure, comprising:

forming a carbon-containing layer over a substrate;

forming a ferroelectric layer over the carbon-containing layer;

forming a second carbon-containing layer over the ferroelectric layer, wherein the second carbon-containing layer is spaced apart from the carbon-containing layer by the ferroelectric layer;

crystallizing the ferroelectric layer by simultaneously annealing the ferroelectric layer, the second carbon-containing layer, and the carbon-containing layer; and removing the second carbon-containing layer to expose a top surface of the ferroelectric layer after the ferroelectric layer is crystallized.

11. The method for forming a device structure as claimed in claim 10, wherein the second carbon-containing layer is formed before the ferroelectric layer is crystallized.

12. The method for forming a device structure as claimed in claim 10, wherein the carbon-containing layer has a lower coefficient of thermal expansion than that of the ferroelectric layer.

13. The method for forming a device structure as claimed in claim 10, further comprising:

forming a bottom electrode over the substrate, wherein the bottom electrode is between the ferroelectric layer and the substrate; and forming a top electrode over the ferroelectric layer.

14. The method for forming a device structure as claimed in claim 10, further comprising:

forming an oxide semiconductor layer over the ferroelectric layer after the ferroelectric layer is crystallized; and forming source/drain electrodes electrically connected to the oxide semiconductor layer.

15. A method for forming a device structure, comprising:

forming an amorphous layer over a substrate, wherein the amorphous layer contains carbon;

forming a ferroelectric layer over the amorphous layer;

crystallizing the ferroelectric layer by simultaneously annealing the ferroelectric layer and the amorphous layer while the ferroelectric layer is covered; and exposing the ferroelectric layer after the ferroelectric layer is crystallized.

16. The method for forming a device structure as claimed in claim 15, further comprising:

forming a second amorphous layer over the ferroelectric layer before the ferroelectric layer is crystallized.

17. The method for forming a device structure as claimed in claim 15, wherein the amorphous layer has a lower coefficient of thermal expansion than that of the ferroelectric layer.

18. The method for forming a device structure as claimed in claim 15, further comprising:

forming a bottom electrode over the substrate, wherein the bottom electrode is between the ferroelectric layer and the substrate; and forming a top electrode over the ferroelectric layer.

19. The method for forming a device structure as claimed in claim 15, further comprising:

forming a channel layer over the ferroelectric layer after the ferroelectric layer is crystallized; and forming source/drain electrodes electrically connected to the channel layer.

20. The method for forming a device structure as claimed in claim 16, further comprising:

completely removing the second amorphous layer after the ferroelectric layer is crystallized.

\* \* \* \* \*